(12) United States Patent
Kanesashi et al.

(10) Patent No.: US 6,537,093 B2
(45) Date of Patent: Mar. 25, 2003

(54) SOCKET FOR A SEMICONDUCTOR DEVICE

(75) Inventors: Hokuto Kanesashi, Kawaguchi (JP); Masami Fukunaga, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 09/726,999

(22) Filed: Nov. 30, 2000

(65) Prior Publication Data

US 2001/0034150 A1 Oct. 25, 2001

(30) Foreign Application Priority Data

Dec. 2, 1999 (JP) .......................................... 11-343532

(51) Int. Cl.[7] .............................................. H01R 11/22
(52) U.S. Cl. ...................................................... 439/268
(58) Field of Search ................................. 439/268, 266, 439/269.1, 263

(56) References Cited

U.S. PATENT DOCUMENTS 6,149,449 A * 11/2000 Abe ............................ 439/268

* cited by examiner

*Primary Examiner*—Javaid Nasri
*Assistant Examiner*—avaid Javaid
(74) *Attorney, Agent, or Firm*—Koda & Androlia

(57) ABSTRACT

In a socket for an electric part, support levers 14 are disposed on opposite sides of a socket body 2 for turning movement about base ends, and a slide plate 15 is attached the support levers 14 through support shafts 16, so that the slide plate laterally and downwards by urging an upper operating member downwards. Thus, the slide plate can be moved easily by urging the operating member by a small force.

4 Claims, 8 Drawing Sheets

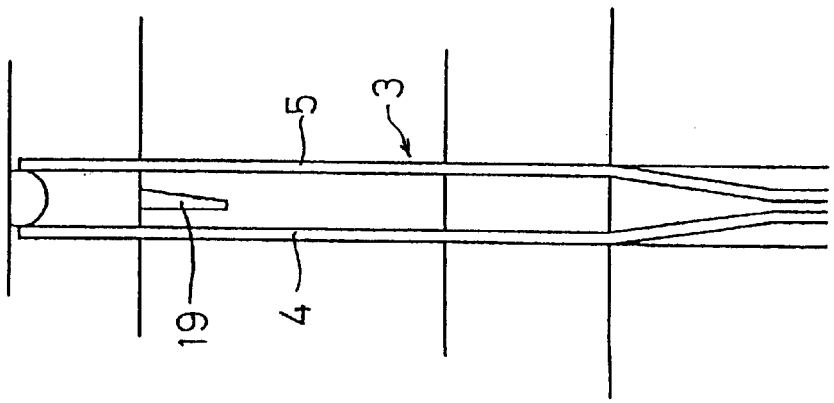
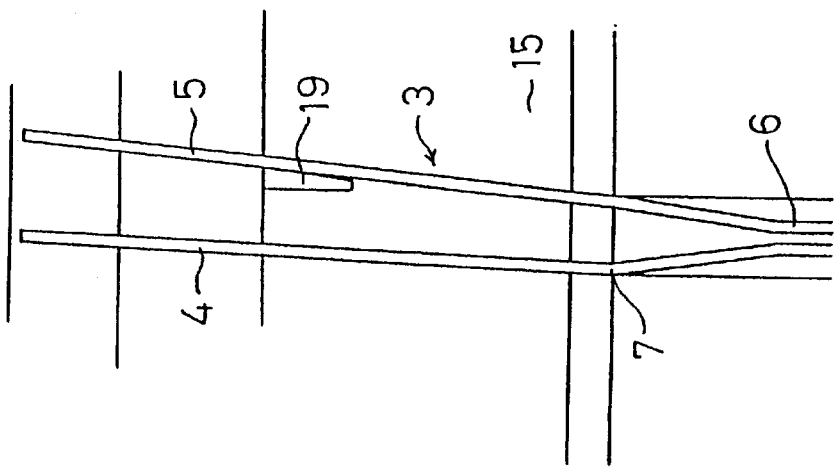

SOCKET FOR A SEMICONDUCTOR DEVICE

BACKGROUND OF THE INVENTION

1. Field of the Invention

The present invention relates to a socket for an electric part and particularly, to a socket for an electric part for electrically connecting terminals of the electric part to a printed wiring board of a measurer in order to carry out a performance test for the electric part.

2. Description of the Related Art

In order to carry out a performance test for an electric part such as a semiconductor device and the like, a socket for an electric part for electrically connecting terminals of the electric part to a printed wiring board of a measurer is conventionally used in many cases.

In such a socket for an electric part, a top plate is disposed on a socket body and designed, so that the electric part is placed on the top plate. Contact pins are disposed on the socket body, and a slide plate is disposed between the top plate and the socket body for sliding movement in a horizontal direction. Further, an upper operating member for moving the slide plate is disposed for vertical movement relative to the socket body.

Thus, the slide plate is slid horizontally through a levering mechanism or a link mechanism by lowering the upper operating member, thereby resiliently deforming the contact pins to spread upper ends of the contact pins. Thereafter, the electric part is placed on the top plate, and the slide plate is moved back to the original position by lifting the upper operating member, thereby releasing an urging force on the contact pins. This causes the contact pins to be returned to their initial positions by their resilient forces, whereby the terminals of the electric part are clamped by the tip ends of the contact pins and electrically connected to the contact pins.

However, the conventional socket for the electric part suffers from the following problem: The slide plate is slid horizontally through the link mechanism or the like by lowering the upper operating member and for this reason, it is necessary to turn the downward urging force into a horizontal direction perpendicular to an urging direction and hence, a large force for urging the upper operating member is required. Another problem is that a large force is also required for returning the upper operating member and hence, it is necessary to ensure an increased biasing force of a spring or the like for returning the upper operating member, resulting in an increase in cost of parts.

SUMMARY OF THE INVENTION

Accordingly, it is an object of the present invention to provide a socket for an electric part, wherein the slide plate can be moved easily by urging the upper operating member by a small force.

To achieve the above object, according to a first aspect and feature of the present invention, there is provided a socket for an electric part, comprising a socket body, a plurality of contact pins disposed on the socket body and capable of being connected to and disconnected from terminals of an electric part, a slide plate movably disposed on the socket body, and an upper operating member, so that the slide plate is moved by the upper operating member, thereby opening and closing tip ends of the contact pins to connect the contact pins to the terminals of the electric part, wherein said socket further include a support lever disposed for turning movement about a base end, and the slide plate is attached to the support lever, so that the slide plate is moved laterally and downwards by urging the upper operating member downwards.

With the above arrangement, the slide plate is moved laterally and downwards by urging the upper operating member downwards. Therefore, the slide plate can be moved easily only by urging the upper operating member by a small force. In addition, because the support lever is turned, less frictional force is produced in the turning movement of the support lever. Therefore, it is possible to suppress a loss of energy during the turning movement to the utmost and hence, the support lever can be turned by a smaller force.

According to a second aspect and feature of the present invention, in addition to the first feature, the socket further includes an urging member disposed on the upper operating member for urging the support lever, so that the support lever is turned by urging the upper operating member downwards.

With the above arrangement, the support lever is turned by urging the upper operating member downwards and hence, the support lever can be turned easily.

According to a third aspect and feature of the present invention, in addition to the first feature, the slide plate is attached to the support lever through a support shaft, and the socket further includes an urging member disposed on the upper operating member for urging the support lever, so that the support lever is turned through the support shaft by urging the upper operating member downwards.

With the above arrangement, the support lever is turned through the support shaft by urging the upper operating member downwards and hence, the support lever can be turned easily. Moreover, a frictional force produced during the urging can be decreased, and the upper operating member can be turned by a smaller force.

According to a fourth aspect and feature of the present invention, in addition to any of the first to third features, a plurality of the support levers are mounted at diagonal portions of the slide plate, respectively, so that the slide plate is moved laterally and downwards, i.e., in a diagonal direction by turning the support levers.

With the above arrangement, the slide plate is moved laterally and downwards, i.e., in a diagonal direction by turning the support levers by turning the support levers by urging the upper operating member downwards. Therefore, the support levers can be turned easily to move the slide plate.

According to a fifth aspect and feature of the present invention, in addition to the fourth feature, the contact pins are disposed obliquely in parallel to the diagonal direction, so that a direction of spreading of the contact pins coincides with a direction of movement of the slide plate.

With the above arrangement, the contact pins are disposed obliquely in parallel to the diagonal direction, so that the direction of spreading of the contact pins coincides with the direction of movement of the slide plate. Therefore, a large space in the direction of spreading of the contact pins can be ensured, and even when the contact pins 3 are disposed more closely, the spreading movements of the contact pins 3 can be conducted reliably, and it is possible to easily accommodate an increase in density of an electric part in recent years.

The above and other objects, features and advantages of the invention will become apparent from the following description of the preferred embodiment taken in conjunction with the accompanying drawings.

BRIEF DESCRIPTION OF THE DRAWINGS

FIG. 7 is a front view of the contact pin shown in FIG. 6, which is in a spread state;

FIG. 8 is a front view of the contact pin shown in FIG. 6, which is in a terminal-clamped state;

DESCRIPTION OF THE PREFERRED EMBODIMENTS

Figure 1:
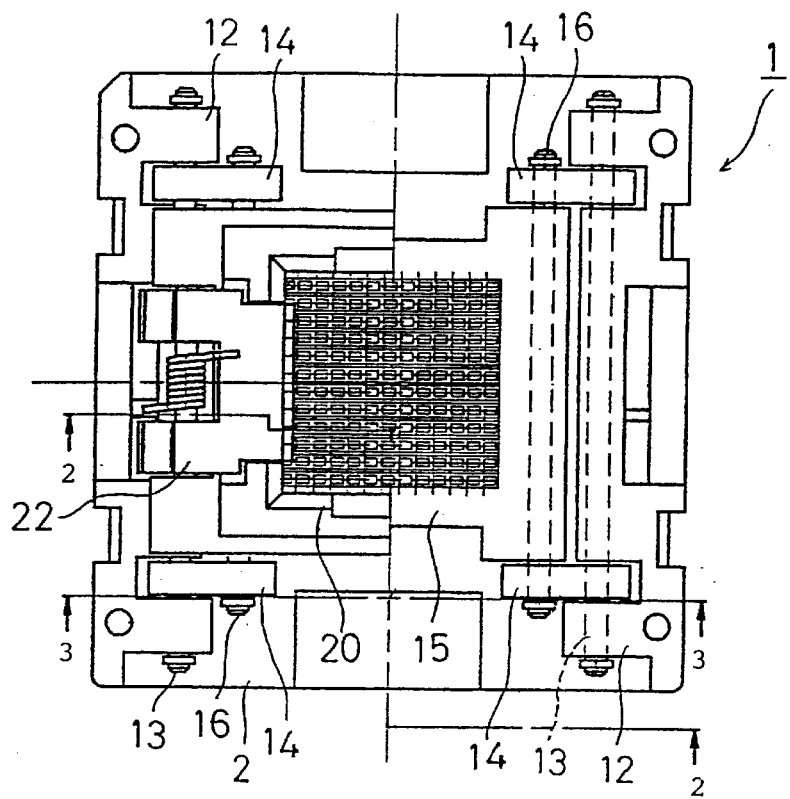
FIG. 1 is a partially sectional plan view of one embodiment of a socket for an electric part according to the present invention.

The present invention will be described by way of an embodiment with reference to FIGS. 1 to 14.

FIGS. 1 to 5 show one embodiment of a socket for an electric part according to the present invention. The socket 1 for the electric part is adapted to electric connect solder balls arranged as terminals of an electric part (not shown) such as an IC package in a lattice fashion and a printed wiring board (not shown) for a measurer in order to carry out a performance test of the electric part.

The socket 1 for the electric part has a socket body 2 mounted on the printed wiring board, and a plurality of contact pins 3 are arranged in a lattice fashion on the socket body 2 to correspond to the solder balls on the electric part.

Each of the contact pins 3 is made of a conductive material, and has a pair of resilient pieces: a stationary resilient piece 4 and a movable resilient piece 5 formed at an upper portion thereof, and a single solder tail 6 integrally formed at a lower portion thereof. Further, portions 7 folded away from each other are formed at intermediate locations on the resilient pieces 4 and 5.

Figure 2:
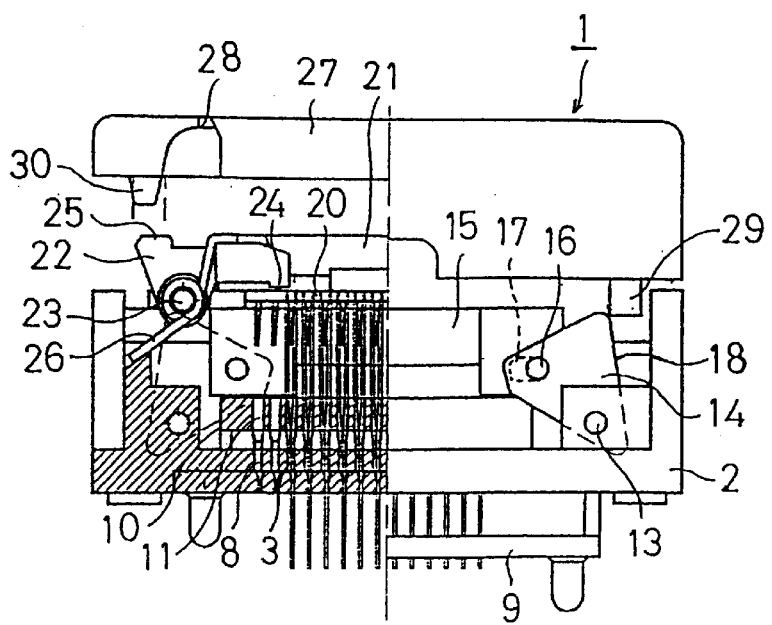
FIG. 2 is a sectional view taken along the line 2—2 in FIG. 1.
Figure 3:
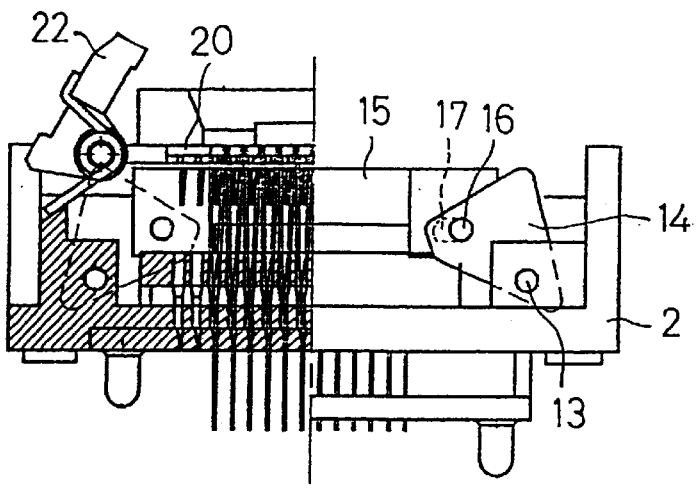
FIG. 3 is a sectional view taken along the line 3—3 in FIG. 1.

The contact pin 3 is held in a righted state with respect to the socket body 2 by press-fitting the solder tail 6 into the press-fit bore 8 defined in the socket body 2. The solder tail 6 protrudes downwards from the socket body 2 past a locating board 9, as shown in FIG. 2. A lower end of each of the solder tails 6 is inserted through each of through-bores (not shown) in the printed wiring board and soldered therein, so that it is connected to the printed wiring board.

A pressing plate 10 is detachably disposed on an inner bottom surface of the socket body 2, and has a plurality of pressing bores 11 defined therein for insertion of the resilient pieces 4 of the contact pins 3. Each of the pressing bores 11 is formed at a width ensuring that in a state in which the resilient pieces 4 and 5 have been inserted into the pressing bore 11, the resilient pieces 4 and 5 can be resiliently deformed with tops of their folded portions 7 pressed toward each other.

In the present embodiment, two pair of support flanges 12 are disposed at opposite ends on opposite sides of the socket body 2, respectively, and a pivot shaft 13 is supported at its opposite ends in each of the pairs of flanges 12. A substantially triangular support lever 14 is attached at one corner thereof to each of the opposite ends of the pivot shafts 13, i.e., an inner portion of each of the flanges 12 for turning movement about the pivot shaft 13. A slide plate 15 is disposed between the support levers 14 above the pressing plate 10, and two support shafts 16 are mounted respectively at opposite ends of the slide plate 15 in parallel to the pivot shafts 13 to extend through the slide plate 15. One of the support shafts 16 is supported in an elongated hole 17 defined in the slide plate 15 for movement within the elongated hole 17.

The support lever 14 is turnably mounted, at its corner closer to a central portion of the socket body 2, to each of opposite ends of the support shaft 16. A side of each of the support levers 14 located at an outer portion of the socket body 2 is an urging side 18. The urging sides 18 of the support levers 14 are held inclined, so that their upper portions are closer to each other.

Figure 6:
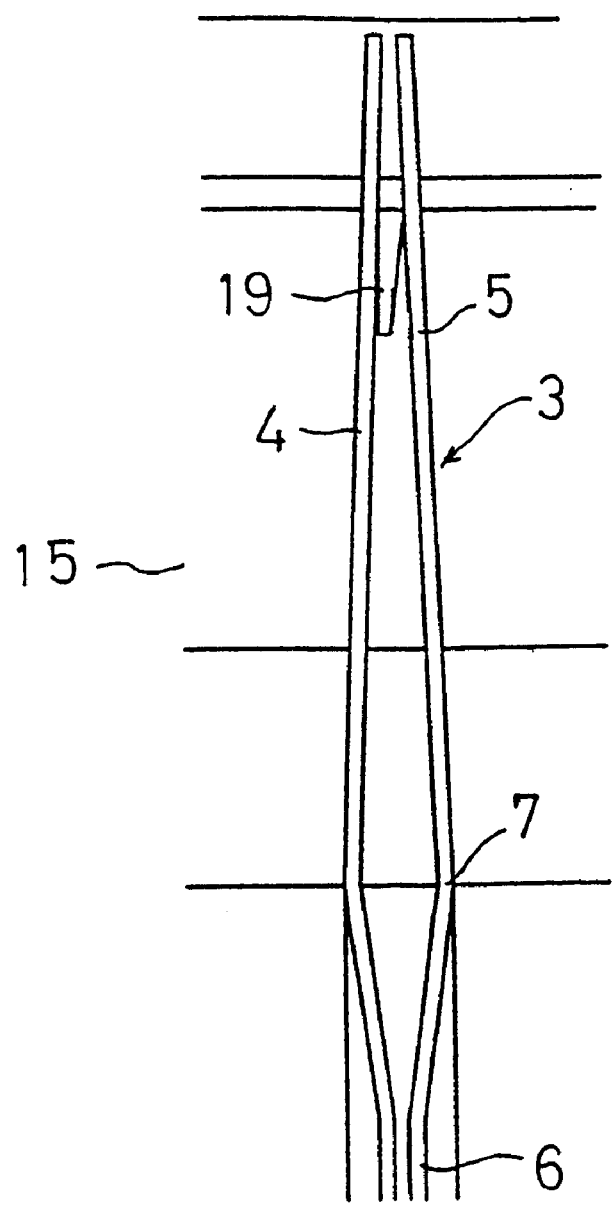
FIG. 6 is a plan view of a contact pin of the socket for the electric part shown in FIG. 1.

Further, the resilient pieces 4 and 5 of each of the contact pins 3 are inserted through the slide plate 15. A contact pin urging portion 19 is formed on the slide plate 15 and located between the resilient pieces 4 and 5 of each of the contact pins 3 for urging and resiliently deforming the movable resilient piece 5 of the contact pin 3, as shown in FIGS. 6 to 8.

When a downward force is applied to the urging side 18 of the support level 14, the support lever 14 is turned about the pivot shaft 13, whereby the slide plate 15 can be moved downwards toward the support lever 14 having the elongated hole 17 defined therein, i.e., laterally and downwards as a whole. The lateral and downward movement of the slide plate 15 causes the movable resilient pieces 5 to be urged and resiliently deformed by the contact pin urging portion 19, whereby a large gap can be ensured between tip ends of the resilient pieces 4 and 5.

Further, a top plate 20 is disposed on an upper surface of the slide plate 15 to support upper ends of the contact pins 3, so that an electric part can be placed on an upper surface of the top plate 20. Guide portions 21 are provided on the top plate 20 in correspondence to corners of an electric part for positioning the electric part at a predetermined location.

A pair of latches 22 are mounted to the socket body 2 on opposite sides of the top plate 20 for vertical turning movement about a shaft 23. Each of the latches 22 has a tip end serving as a part retaining portion 24 for retaining a peripheral edge of the electric part, and a base end upper portion serving as portion to be urged 25. Further, each of the latches 22 is biased by a biasing force of a spring 26 in such a direction that the part retaining portion 24 comes into contact with the upper surface of the top plate 20. When an urging force is applied to he portion to be urged 25, the latch 22 is turned against the biasing force of the spring 26, so that the part retaining portion 24 is retracted from a position for disposition of the electric part.

An upper operating member 27 is vertically movably disposed above the top plate 20, and has an opening 28 defined therein at a size enabling the insertion of the electric part. The top plate 20 is normally biased upwards by a biasing means (not shown) such as a spring. Alternatively, the top plate 20 may be fixed at a predetermined location without being biased upwards. An urging projection 29 is formed on a lower surface of the upper operating member 27 for urging the urging side 18 of the support lever 14 by the lowering movement of the upper operating member 27, and an urging portion 30 is also formed on the lower surface of the upper operating member 27 for urging the portion to be urged 25 of the latch 22.

The operation of this embodiment will be described below.

Figure 4:
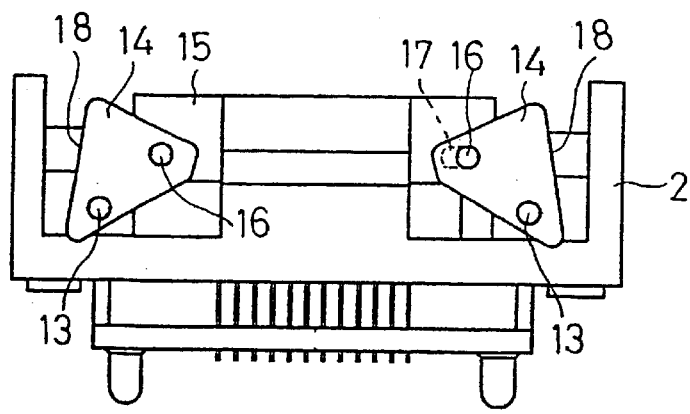
FIG. 4 is a side view showing a slide plate of the socket for the electric part shown in FIG. 1, which is in a usual state.
Figure 5:
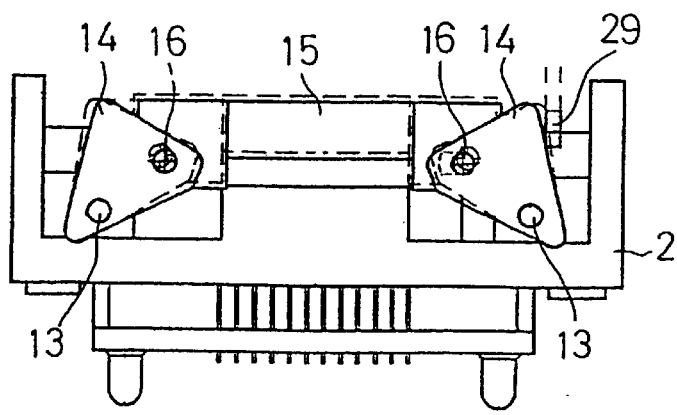
FIG. 5 is a side view of the slide plate shown in FIG. 4, which is in a moving state.

To mount an electric part on the socket 1, the upper operating member 27 is first pushed downwards from a state shown in FIGS. 2 and 4, whereby the urging projection 29 of the upper operating member 27 pushes the urging side 18 of the support lever 14 downwards. When a downward force is applied to the urging sides 18 of the support levers 14 in the above manner, the support levers 14 are turned inwards toward to each other about the pivot shafts 13, because the urging sides 18 are inclined. Thus, the slide plate 15 is moved laterally and downwards, i.e., obliquely downwards, by the turning movement of the support levers 14. In this case, the escaping of one of the support shafts 16 is absorbed by the elongated hole 17 defined in one side of the slide plate 15.

The movable resilient piece 5 is urged and resiliently deformed by the contact pin urging portion 19 with the lateral and downward movement of the slide plate 15, whereby the tip ends of the resilient pieces 4 and 5 are spread from a state shown in FIG. 6, as shown in FIG. 7.

In this case, the slide plate 15 is moved laterally and downwards in the present embodiment. Therefore, the slide plate 15 can be moved easily by urging the upper operating member 27 by a small force, as compared with a prior art. In addition, the support level 14 is turned and hence, a friction force is less produced in the turning movement of the support lever 14. Therefore, a loss of energy in the turning movement can be suppressed to the utmost and thus, the support lever 14 can be turned by a smaller force.

At the same time, the portion to be urged 25 of the latch 22 is urged by the urging portion 30 of the upper operating member 27 and turned against the biasing force of the spring 26, whereby the part retaining portion 24 is moved to its retracted position.

In this state, the electric part is guided by the guide portions 21 and placed at a predetermined location on the upper surface of the top plate 20, and the solder balls of the electric part are inserted between the spread tip ends of the contact pins 3.

When the downward urging force on the upper operating member 27 is thereafter removed, the upper operating member 27 is lifted by the biasing force of the biasing member, whereby the slide plate 15 is moved laterally and upwards and at the same time, the latches 22 are turned by the biasing force of the spring 26, so that the peripheral edge of the electric part is retained by the part retaining portions 24.

On the other hand, when the slide plate 15 is moved laterally and upwards to its original position, the urging force on the movable resilient pieces 5 of the contact pins 3 is released, whereby the movable resilient pieces 5 are restored to the original positions, and the solder balls of the electric part are clamped by the tip ends of the movable resilient pieces 5 and the tip ends of the stationary resilient pieces 4. Thus, the solder balls of the electric part are electrically connected to the printed wiring board through the contact pins 3.

To remove the electric part from the mounted state, the tip ends of the contact pins 3 are spread by lowing the upper operating member 27 in a similar manner. Thus, the solder balls of the electric part are removed from the contact pins 3, and hence, the electric part can be removed simply by a weak force.

Therefore, in the present embodiment, the slide plate 15 is moved laterally and downwards by urging the urging sides 18 of the support levers 14 to turn the support levers 14 and hence, the slide plate 15 can be moved easily only urging the upper operating member 27 by a smaller force. Conversely, to return the slide plate 15, it can be moved by a smaller force. Further, the slide plate 15 is moved by turning the support levers 14 and hence, less frictional force is produced in the turning movement of the support levers 14. Therefore, a loss of energy during the turning movement can be suppressed to the utmost, and the support levers 15 can be turned by a smaller force.

In the present embodiment, the slide plate 15 is moved by the turning movement of the support levers 14 mounted at the four corners of the slide plate 15 and hence, the structure of the socket has no mechanism provided at a location in the vicinity of a central portion of the slide plate 15 for moving the slide plate 15. Therefore, it is possible to radiate heat present in the inside of the socket body 2 by defining a venting hole in the side of the socket body 2.

Figure 9:
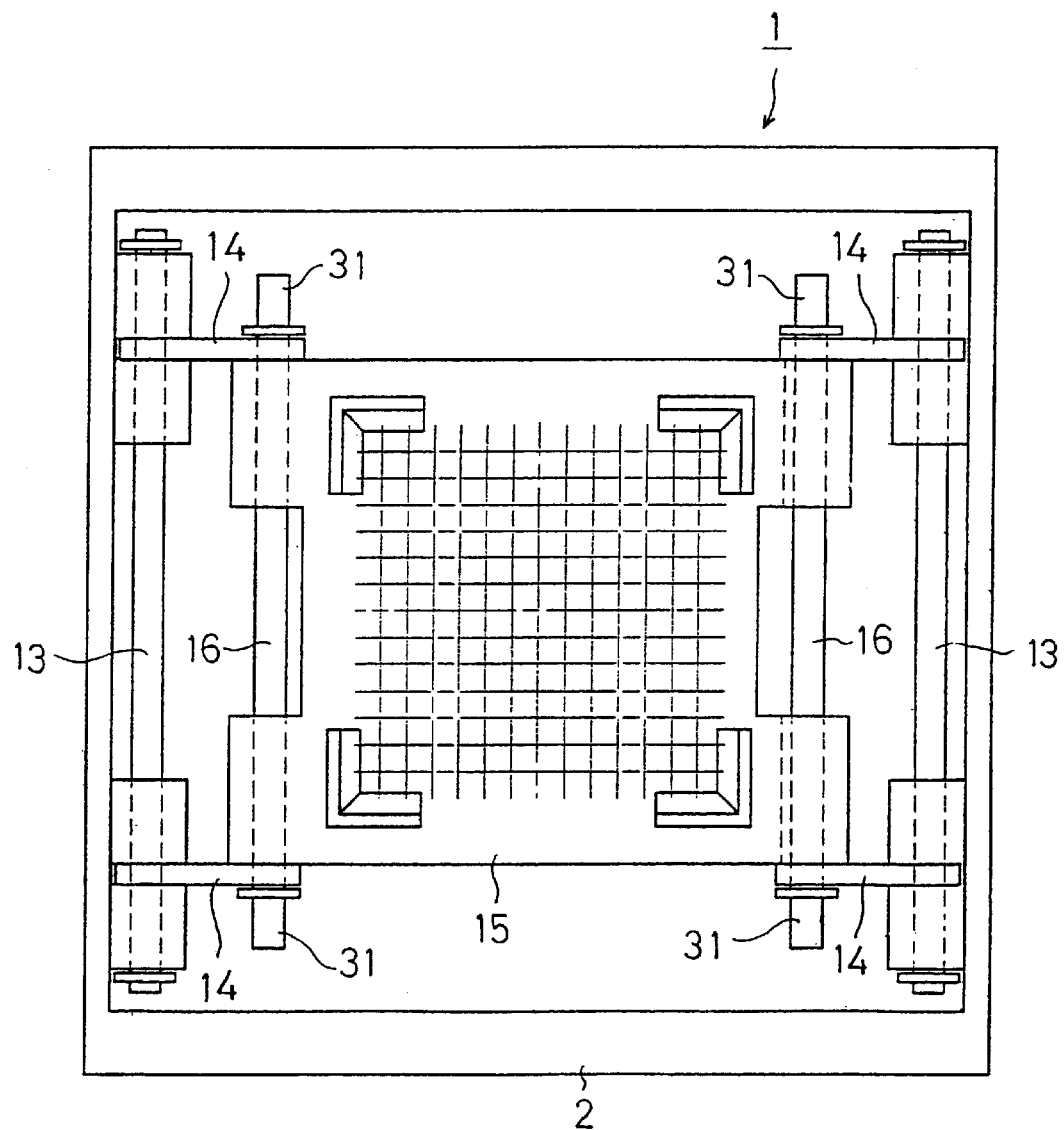
FIG. 9 is a plan view of a second embodiment of a socket for an electric part according to the present invention.
Figure 10:
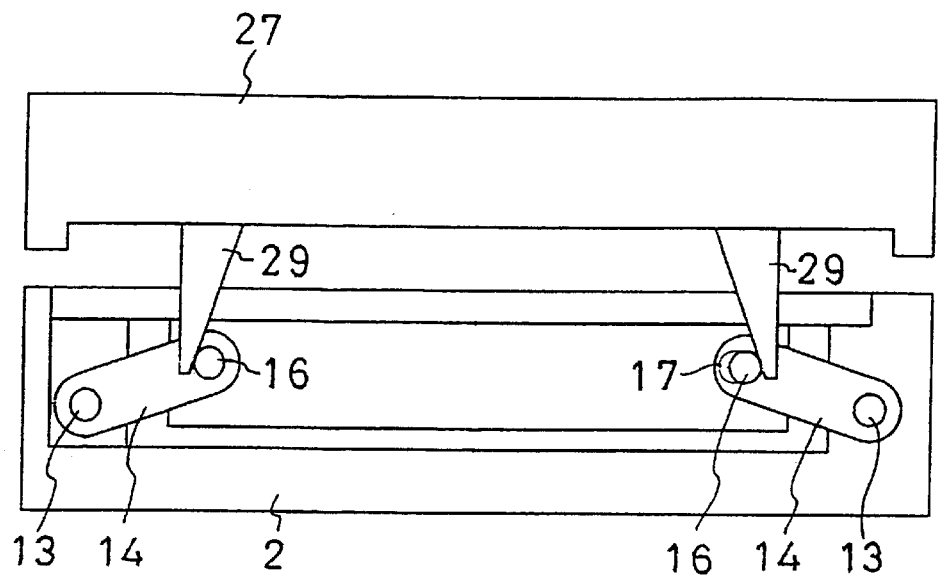
FIG. 10 is a side view showing a slide plate of the socket for the electric part shown in FIG. 9, which is in a usual state.
Figure 11:
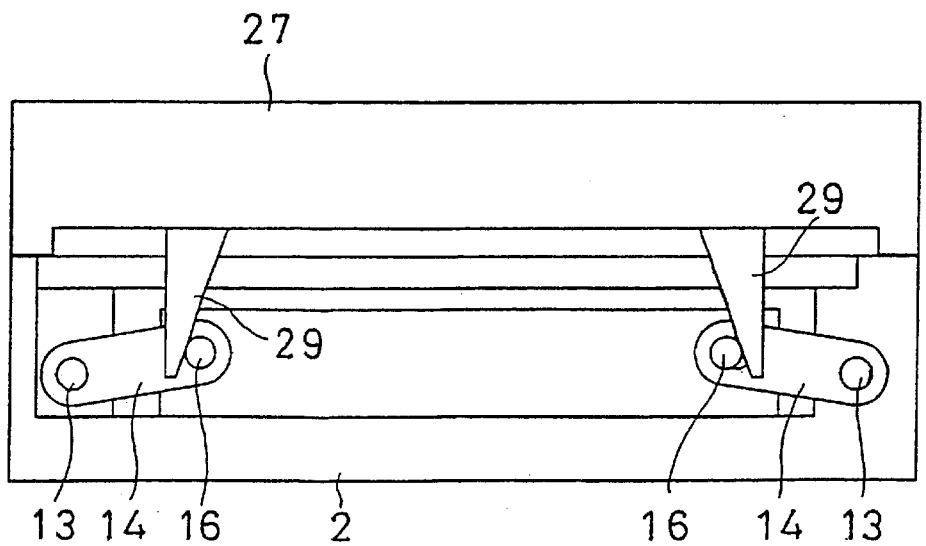
FIG. 11 is a side view of the slide plate shown in FIG. 10, which is in a moving state.

FIGS. 9 to 11 show a second embodiment of the present invention. In the second embodiment, each of support levers 14 is formed into a link shape. The support levers are turnably mounted at their base ends to opposite ends of pivot shafts 13 and at their tip ends to opposite ends of support shafts 16 for a slide plate 15.

Further, in the second embodiment, each of the support shafts 16 is formed at each of its opposite ends with an urging portion 31 extending from a point at which the support lever 14 is mounted, and urging projections 29 of an upper operating member 27 are disposed at locations corresponding to the urging portions 31 of the support shafts 16. The urging projections 29 are disposed to abut against outer peripheral surfaces of the urging portions 31 of the support shafts 16, and faces of the urging projections 29 contacting with the urging portions 31 are inclined faces.

Other portions are similar to those in the previous embodiment and hence, portions or components corresponding to those in the previous embodiment are designated by like reference characters, and the description of them is omitted.

In the second embodiment, the urging projections 29 of the upper operating member 27 push the urging portions 31 of the support shafts 16 downwards by pushing the upper operating member 27 downwards. When a downward force is applied to the urging portions 31 of the support shafts 16, the support shafts 16 are moved inwards, because the faces of the urging projections 29 contacting with the urging portions 31 are inclined. The support levers 14 are turned about the pivot shafts 13 by the movement of the support shafts 16, and the slide plate 15 is moved laterally and downwards, i.e., obliquely downwards by the turning movement of the support levers 14.

The tip ends of the resilient pieces 4 and 5 of the contact pins 3 are spread with the oblique downward movement of the slide plate 15 to clamp solder balls of an electric part.

Therefore, even in the second embodiment, the support levers 14 are turned by urging the urging portions 31 of the support shafts 16 by the urging projections 29 of the upper operating member 27, thereby moving the slide plate 15 obliquely downwards, as in the previous embodiment. Therefore, the slide plate 15 can be moved easily only by urging the upper operating member 28 by a small force, and the returning movement of the slide plate 15 can be also conducted by a small force. Further, because the slide plate 15 is moved by the turning movement of the support levers 14, less frictional force is produced in the turning movement of the support levers 14, and the support levers 14 can be turned by a smaller force.

Further, each of the support shafts is formed from a metal material, and the upper operating member 27 is formed from a resin material. The support shafts 16 made of the metal material are urged by the urging projections 29 made of the resin material. Therefore, the frictional force produced during the urging can be decreased remarkably, as compared with a case where a member made of a resin material is urged, and the urging of the upper operating member 27 can be conducted by a smaller force.

Figure 12:
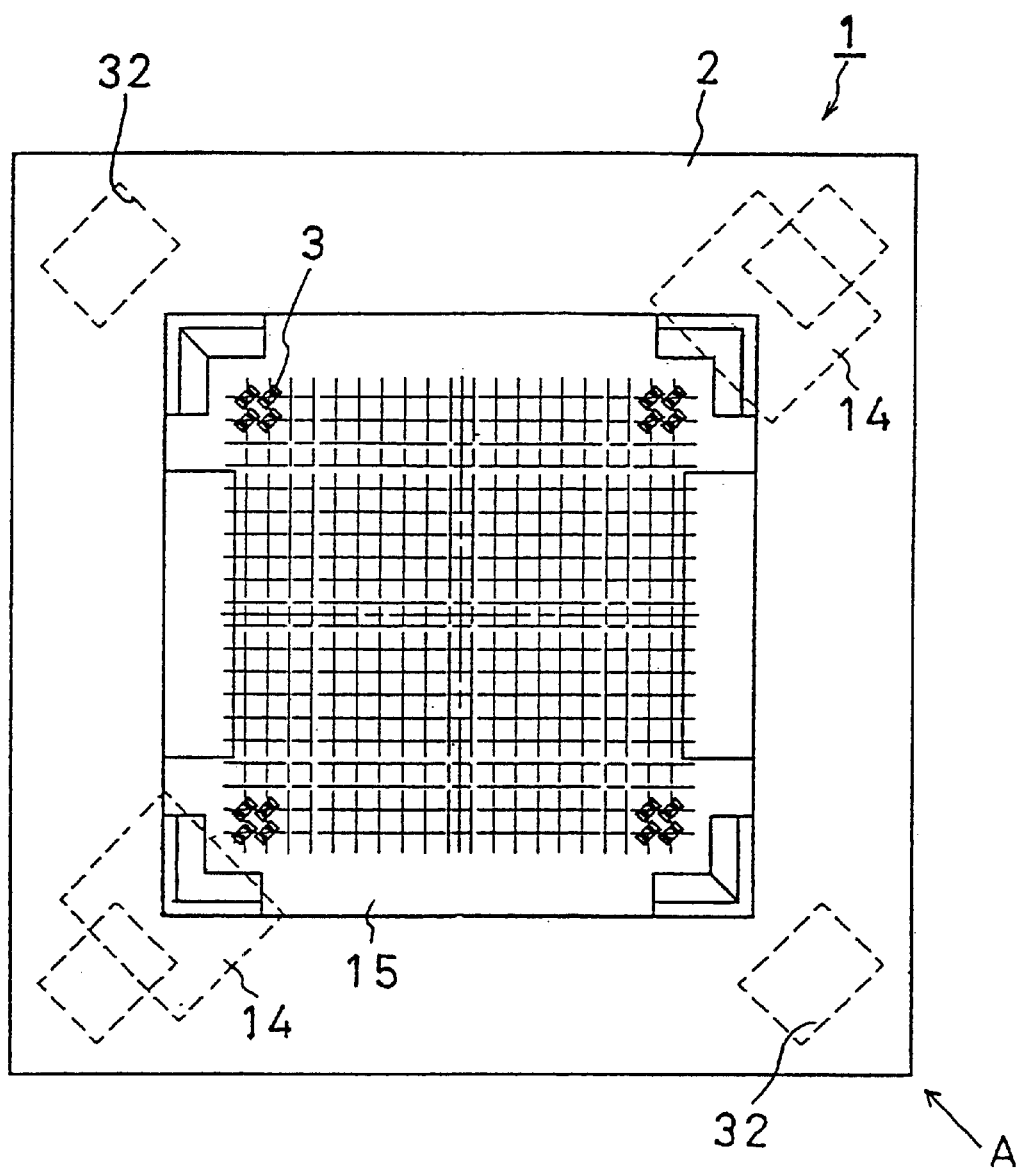
FIG. 12 is a plan view of a third embodiment of a socket for an electric part according to the present invention.
Figure 13:
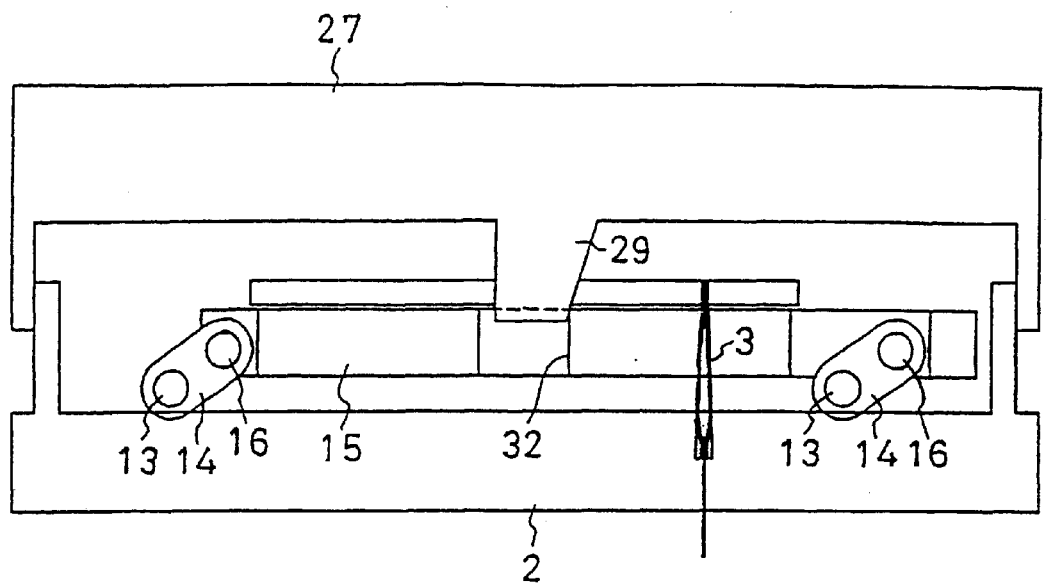
FIG. 13 is a side view showing a slide plate of the socket for the electric part shown in FIG. 12, which is in a usual state.
Figure 14:
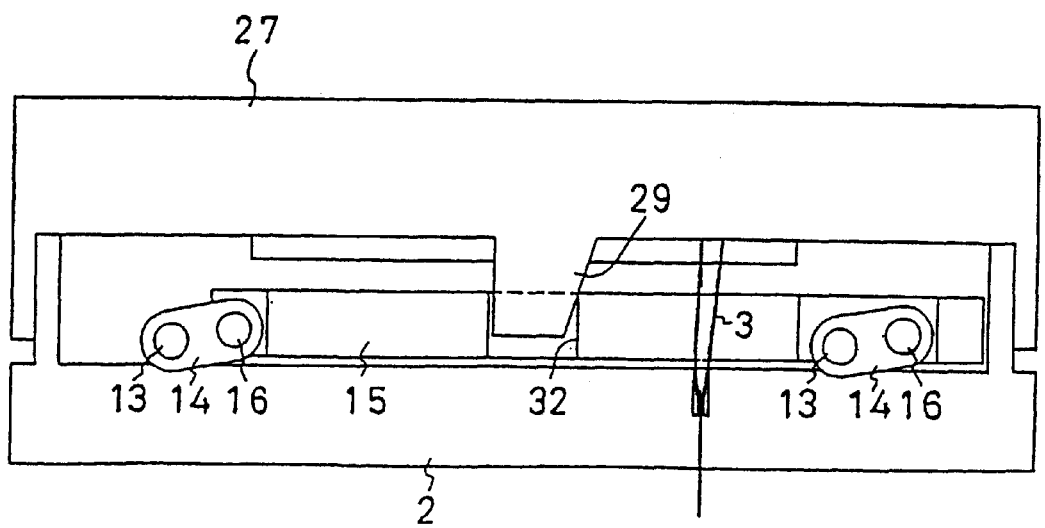
FIG. 14 is a side view of the slide plate shown in FIG. 13, which is in a moving state.

FIGS. 12 to 14 show a third embodiment of the present invention. FIGS. 13 and 14 are views of a socket shown in FIG. 12 taken in a sideways direction indicated by an arrow A.

In the third embodiment, link-shaped support levers 14 are mounted at diagonal portions of a slide plate 15, respectively, so that the slide plate 15 is moved obliquely downwards in a diagonal direction. Additionally, in the third embodiment, all of the support levers 14 are adapted to be turned in the same direction. An elongated hole for escaping the movement of support shafts 16 is not provided in the support lever 14.

Urging bores 32 are defined in other diagonal portions of the slide plate 15, and urging projections 29 are formed on an upper operating member 27 at locations corresponding to the urging bores 32 and inserted into the urging bores 32, respectively.

In the third embodiment, contact pins 3 are disposed obliquely in parallel to a diagonal direction, so that a direction of spreading of the contact pins 3 coincides with a direction of movement of the slide plate 15.

Other portions or components are similar to those in each of the previous embodiments and hence, are designated by like reference characters, and the description of them is omitted.

In the third embodiment, by pushing the upper operating member 27 downwards, the slide plate 15 is pushed downwards, while the urging projections 29 of the upper operating member 27 are inserted into the urging bores 32 in the slide plate 15. This causes the support levers 14 to be turned about the pivot shafts 13, and the slide plate 15 is moved in a lateral direction which is a diagonal direction of the slide plate 15, i.e., obliquely downwards as a whole.

The tip ends of the resilient pieces 4 and 5 of the contact pins 3 are spread with the oblique downward movement of the slide plate 15 to clamp solder balls of an electric part.

Therefore, even in the third embodiment, the support levers 14 are turned by urging the urging bores 32 in the slide plate 15 by the urging projections 29 of the upper operating member 27, thereby moving the slide plate 15 obliquely downwards, as in each of the previous embodiments. Thus, the slide plate 15 can be moved easily only by urging the upper operating member 27 by a small force, and the returning movement of the slide plate 15 can be also conducted by a small force. Further, because the slide plate 15 is moved by the turning movement of the support levers 14, less frictional force is produced during turning of the support levers 14, and the support levers 14 can be turned by a smaller force.

Further, since the contact pins 3 are disposed obliquely in parallel to the diagonal direction, so that the direction of spreading of the contact pins 3 coincides with the direction of movement of the slide plate 15, in the third embodiment, a space as large as about 1.4 times in the direction of spreading the contact pins can be ensured. Even when the contact pins 3 are disposed more closely, the spreading movements of the contact pins 3 can be conducted reliably, and it is possible to easily accommodate an increase in density of an electric part in recent years.

Although the embodiments of the present invention have been described in detail, it will be understood that the present invention is not limited to the above-described embodiments, and various modifications in design may be made without departing from the spirit and scope of the invention defined claims. For example, a support arm for supporting the slide plate 15 may be provided on one side, and the construction on the other side may be such that the oblique downward movement of the slide plate 15 is realized by a structure in which a boss is formed on one of the slide plate 15 and the socket body 2, and a guide groove is defined in the other.

What is claimed is:

1. A socket for an electric part, comprising a socket body, a plurality of contact pins disposed on said socket body and capable of being connected to and disconnected from terminals of an electric part, a slide plate movably disposed on said socket body, and an upper operating member, so that said slide plate is moved by said upper operating member, thereby opening and closing tip ends of said contact pins to connect said contact pins to the terminals of the electric part, wherein said socket further includes a support lever disposed for turning movement about a base end, said slide plate is attached to said support lever, so that said slide plate is moved both laterally and downwardly along a diagonal or oblique direction by urging said upper operating member downwards and said socket further includes an urging member disposed on said upper operating member for urging said support lever from outside, so that said support lever is turned in an inside direction relative to the socket body by urging said upper operating member downwards to move the slide plate.

2. A socket for an electric part, comprising a socket body, a plurality of contact pins disposed on said socket body and capable of being connected to and disconnected from terminals of an electric part, a slide plate movably disposed on said socket body, and an upper operating member, so that said slide plate is moved by said upper operating member, thereby opening and closing tip ends of said contact pins to connect said contact pins to the terminals of the electric parts wherein said socket further includes a support lever disposed for turning movement about a base end, said slide plate is attached to said support lever, so that said slide plate is moved both laterally and downwardly along a diagonal or oblique direction by urging said upper operating member downwards and said slide plate is attached to said support lever through a support shaft, and said socket further includes an urging member disposed on said upper operating member for urging said support lever, so that said support lever is turned through said support shaft by urging said upper operating member downwards.

3. A socket for an electric past according to any of claims 1 and 2, wherein a plurality of said support levers are mounted at diagonal portions of said slide plate, respectively, so that said slide plate is moved laterally and downwards in a diagonal direction by turning said support levers.

4. A socket for an electric part according to claim 3, wherein said contact pins are disposed obliquely in parallel to the diagonal direction, so that a direction of spreading of said contact pins coincides with a direction of movement of said slide plate.

* * * * *